(12) United States Patent
Chen

(10) Patent No.: US 11,980,029 B2
(45) Date of Patent: May 7, 2024

(54) ERASABLE PROGRAMMABLE SINGLE-PLOY NON-VOLATILE MEMORY CELL AND ASSOCIATED ARRAY STRUCTURE

(71) Applicant: eMemory Technology Inc., Hsin-Chu (TW)

(72) Inventor: Hsueh-Wei Chen, Hsinchu County (TW)

(73) Assignee: EMEMORY TECHNOLOGY INC., Hsin-Chu (TW)

( * ) Notice: Subject to any disclaimer, the term of this patent is extended or adjusted under 35 U.S.C. 154(b) by 142 days.

(21) Appl. No.: 17/883,652

(22) Filed: Aug. 9, 2022

(65) Prior Publication Data

US 2023/0157017 A1    May 18, 2023

Related U.S. Application Data

(60) Provisional application No. 63/279,184, filed on Nov. 15, 2021.

(51) Int. Cl.
| | |
|---|---|
| *G11C 16/04* | (2006.01) |
| *G11C 16/10* | (2006.01) |
| *G11C 16/14* | (2006.01) |
| *G11C 16/26* | (2006.01) |
| *H10B 41/35* | (2023.01) |
| *H10B 41/70* | (2023.01) |

(52) U.S. Cl.
CPC ........... *H10B 41/70* (2023.02); *G11C 16/045* (2013.01); *G11C 16/10* (2013.01); *G11C 16/14* (2013.01); *G11C 16/26* (2013.01); *H10B 41/35* (2023.02)

(58) Field of Classification Search
CPC .................................................. H01L 27/11524
See application file for complete search history.

(56) References Cited

U.S. PATENT DOCUMENTS

| | | | |
|---|---|---|---|
| 7,876,615 B2 | 1/2011 | Liu et al. | |
| 7,948,020 B2 | 5/2011 | Roizin et al. | |
| 8,941,167 B2 | 1/2015 | Chen et al. | |
| 9,601,501 B2 | 3/2017 | Tsao et al. | |
| 2015/0221663 A1* | 8/2015 | Tan ..................... H01L 29/7885 |
| | | | 257/300 |

* cited by examiner

*Primary Examiner* — Jason Lappas
(74) *Attorney, Agent, or Firm* — WPAT, P.C

(57) ABSTRACT

An erasable programmable single-poly non-volatile memory cell and an associated array structure are provided. The memory cell comprises a select transistor and a floating gate transistor. The floating gate of the floating gate transistor and an assist gate region are collaboratively formed as a capacitor. The floating gate of the floating gate transistor and an erase gate region are collaboratively formed as another capacitor. Moreover, the select transistor, the floating gate transistor and the two capacitors are collaboratively formed as a four-terminal memory cell. Consequently, the size of the memory cell is small, and the memory cell is operated more easily.

20 Claims, 10 Drawing Sheets

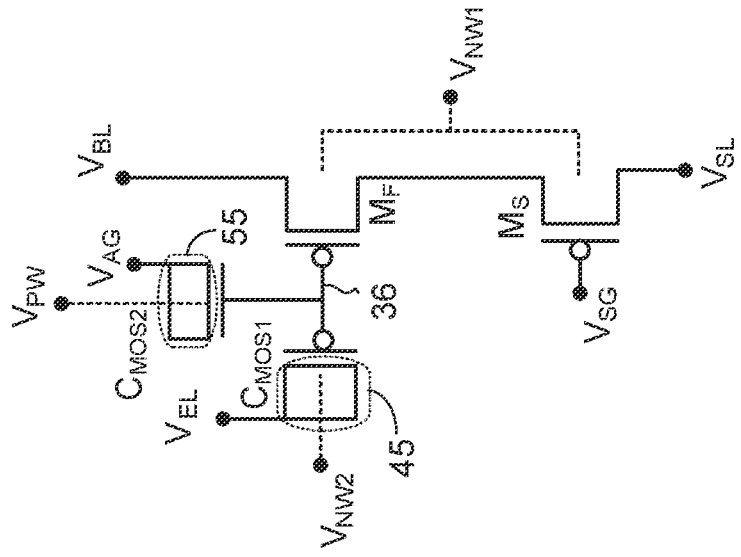
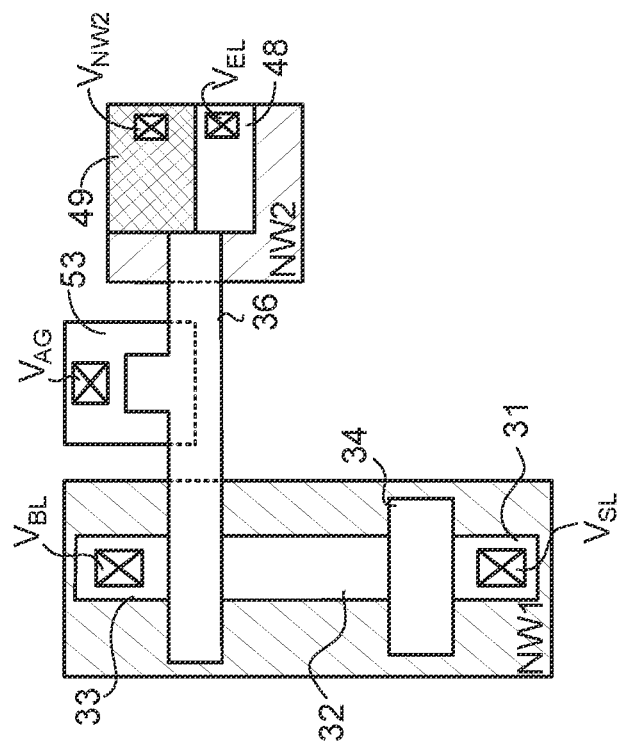
FIG. 1A (PRIOR ART)
FIG. 1B (PRIOR ART)

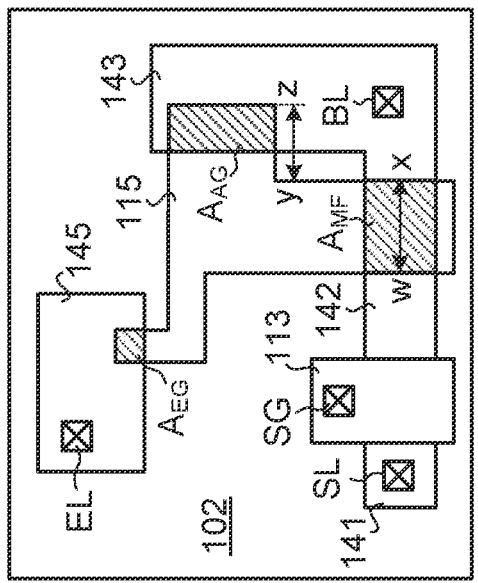
FIG. 2D
FIG. 2E
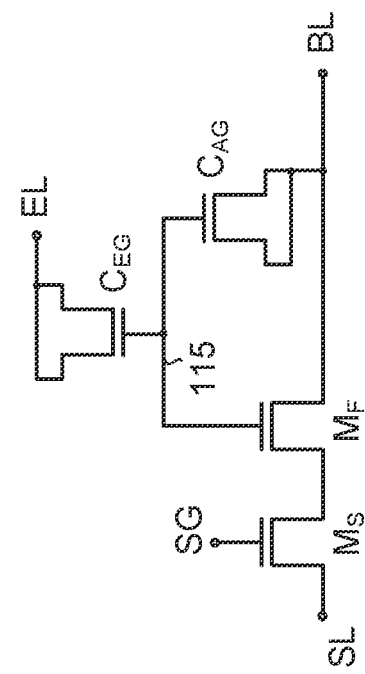
FIG. 2F
FIG. 2G

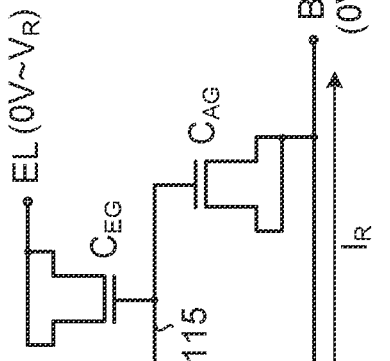
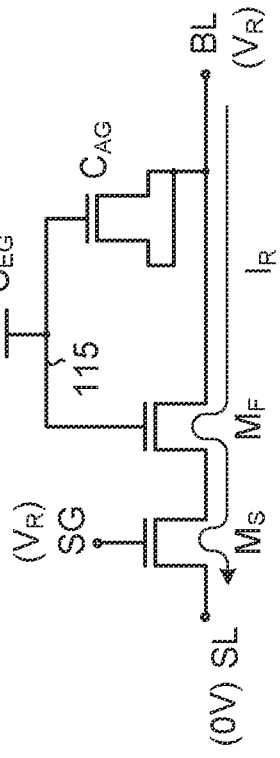
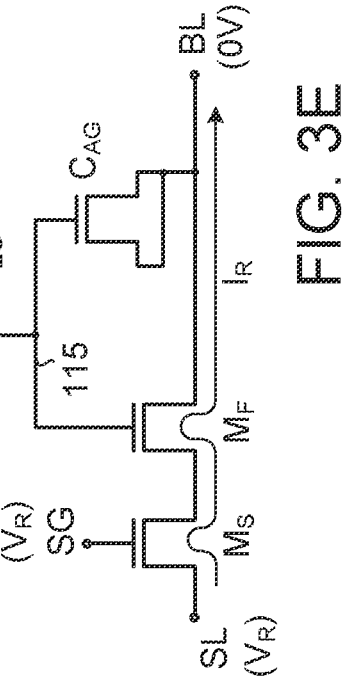
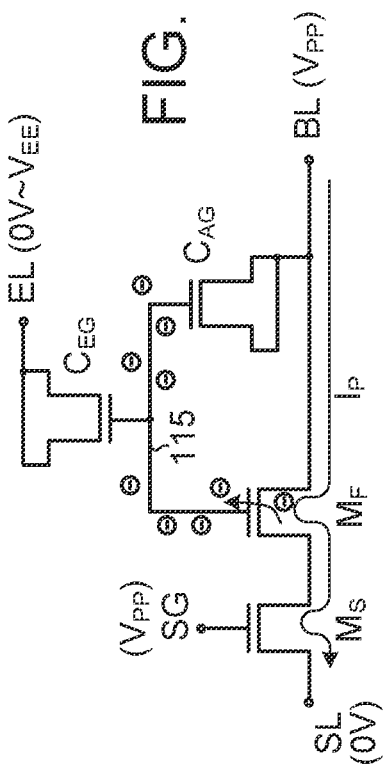
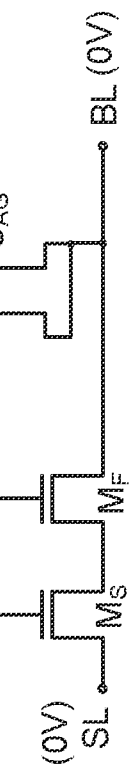
FIG. 3A
FIG. 3B
FIG. 3C
FIG. 3D
FIG. 3E

| | SL | SG | BL | EL | AG | PW |
|---|---|---|---|---|---|---|
| PGM | 0V | $V_{PP}$ | $V_{PP}$ | $0V \sim V_{EE}$ | $0V \sim V_{AG}$ | 0V |
| ERS | 0V | 0V | 0V | $V_{EE}$ | $-V_{AG} \sim 0V$ | 0V |
| Read_1 | 0V | $V_R$ | $V_R$ | $0V \sim V_R$ | $-V_{AG} \sim V_{AG}$ | 0V |
| Read_2 | $V_R$ | $V_R$ | 0V | $0V \sim V_R$ | $-V_{AG} \sim V_{AG}$ | 0V |

ERASABLE PROGRAMMABLE SINGLE-PLOY NON-VOLATILE MEMORY CELL AND ASSOCIATED ARRAY STRUCTURE

This application claims the benefit of U.S. provisional application Ser. No. 63/279,184, filed Nov. 15, 2021, the subject matter of which is incorporated herein by reference.

FIELD OF THE INVENTION

The present invention relates to a non-volatile memory, and more particularly to an erasable programmable single-poly non-volatile memory cell and an associated array structure.

BACKGROUND OF THE INVENTION

As is well known, a memory cell of a non-volatile memory comprises a storage unit. For example, the storage unit is a floating gate transistor. The storage state of the memory cell is determined according to the number of charges stored in the floating gate of the floating gate transistor.

In order to be compatible with the standard CMOS manufacturing process, the memory cell of the conventional non-volatile memory is equipped with a single-poly floating gate transistor. The floating gate transistor and associated electronic devices are collaboratively formed as a single-poly non-volatile memory cell.

For example, an erasable programmable single-poly non-volatile memory is disclosed in U.S. Pat. No. 8,941,167. FIG. 1A is a schematic top view illustrating a conventional single-poly non-volatile memory cell. FIG. 1B is a schematic equivalent circuit diagram of the single-poly non-volatile memory cell as shown in FIG. 1A. For succinctness, the single-poly non-volatile memory cell is referred hereinafter as a memory cell.

As shown in FIG. 1A, three p-type doped regions 31, 32 and 33 are formed in an N-well region NW1. In addition, a select gate 34 and a floating gate 36 formed of a polysilicon layer are spanned over the areas between the p-type doped regions 31, 32 and 33. The floating gate 36 is externally extended to a region beside a p-type doped region 48 and an n-type doped region 49. The p-type doped region 48 and the n-type doped region 49 are formed in an N-well region NW2. In addition, the floating gate 36 is also located beside an n-type doped region 53.

The conventional single-poly non-volatile memory cell comprises a select transistor $M_S$, a floating gate transistor $M_F$, a p-type transistor and an n-type transistor. The select transistor $M_S$ and the floating gate transistor $M_F$ are constructed in the N-well region NW1. The p-type transistor is constructed in the N-well region NW2. The n-type transistor is constructed in a P-well region PW (not shown), which is located under the n-type doped region 53.

The p-type doped region 31, the p-type doped region 32, the select gate 34 and the N-well region NW1 are collaboratively formed as the select transistor $M_S$. The p-type doped region 32, the p-type doped region 33, the floating gate 36 and the N-well region NW1 are collaboratively formed as the floating gate transistor $M_F$. The floating gate 36 and an erase gate region 45 are collaboratively formed as the p-type transistor. The floating gate 36 and an assist gate region 55 are collaboratively formed as the n-type transistor. In addition, the erase gate region 45 comprises the N-well region NW2, the p-type doped region 48 and the n-type doped region 49. The assist gate region 55 comprises the P-well region PW and the n-type doped region 53.

Please refer to FIG. 1B. The select gate 34 of the select transistor $M_S$ receives a select gate voltage $V_{SG}$. The first drain/source terminal of the select transistor $M_S$ receives a source line voltage $V_{SL}$. The body terminal of the select transistor $M_S$ receives an N-well voltage $V_{NW1}$. The first drain/source terminal of the floating gate transistor $M_F$ is connected to the second drain/source terminal of the select transistor $M_S$. The second drain/source terminal of the floating gate transistor $M_F$ receives a bit line voltage $V_{BL}$. The body terminal of the floating gate transistor $M_F$ receives the N-well voltage $V_{NW1}$.

Moreover, it is regarded that the two drain/source terminals of the p-type transistor are connected to the p-type doped region 48. The body terminal of the p-type transistor receives an N-well voltage $V_{NW2}$. That is, the p-type transistor is formed as a metal-oxide-semiconductor capacitor $C_{MOS1}$. Hereinafter, the metal-oxide-semiconductor capacitor is also referred as a MOS capacitor. The first terminal of the MOS capacitor $C_{MOS1}$ is connected to the floating gate 36. The second terminal of the MOS capacitor $C_{MOS1}$ receives an erase line voltage $V_{EL}$.

Similarly, it is regarded that the two drain/source terminals of the n-type transistor are connected to the n-type doped region 53. The body terminal of the n-type transistor receives a P-well voltage $V_{PW}$. That is, the p-type transistor is formed as a MOS capacitor $C_{MOS2}$. The first terminal of the MOS capacitor $C_{MOS2}$ is connected to the floating gate 36. The second terminal of the MOS capacitor $C_{MOS2}$ receives an assist gate voltage $V_{AG}$.

By providing proper bias voltages as the select gate voltage $V_{SG}$, the source line voltage $V_{SL}$, the bit line voltage $V_{BL}$, the erase line voltage $V_{EL}$, the assist gate voltage $V_{AG}$, the N-well voltage $V_{NW1}$, the N-well voltage $V_{NW2}$ and the P-well voltage $V_{PW}$, a program action, an erase action or a read action can be selectively performed on the non-volatile memory cell.

In the assist gate region 55, the second terminal of the MOS capacitor $C_{MOS2}$ receives the assist gate voltage $V_{AG}$. While the program action, the erase action or the read action is performed, the assist gate voltage $V_{AG}$ is coupled to the floating gate 36 in order to enhance the programming efficiency, the erasing efficiency or the reading speed of non-volatile memory cell.

As mentioned above, the conventional single-poly non-volatile memory cell comprises the assist gate region 55. Consequently, the conventional non-volatile memory cell can be regarded as a five-terminal memory cell.

SUMMARY OF THE INVENTION

An embodiment of the present invention provides an array structure of erasable programmable non-volatile memory cells. The array structure is constructed in a semiconductor substrate. The array structure comprises: an isolation structure formed on the semiconductor substrate, wherein a surface of the semiconductor substrate is divided into a first region and a second region by the isolation structure; a well region formed in the surface of the semiconductor substrate corresponding to the first region; a first gate structure and a second gate structure formed on the surface of the semiconductor substrate corresponding to the first region, wherein the first region is divided into a first sub-region, a second sub-region and a third sub-region by the first gate structure and the second gate structure, wherein the first sub-region is located beside a first side of the first gate structure, the second sub-region is arranged between a second side of the first gate structure and a first side of the second gate structure, and the third sub-region is located beside a second side of the second gate structure, wherein the first gate structure is connected to a first select gate line, an extension segment of the second gate structure is externally extended from the second gate structure through a surface of the isolation structure, a portion of the second region is covered by a first portion of the second gate structure, and a portion of the third sub-region is covered by a second portion of the second gate structure; a first doped region, a second doped region and a third doped region formed in the surface of the semiconductor substrate corresponding to the first sub-region, the second sub-region and the third sub-region, respectively, wherein the first doped region is connected to a first source line, and the third doped region is connected to a first bit line; and, a fourth doped region formed in the surface of the semiconductor substrate corresponding to the second region, wherein the fourth doped region is connected to an erase line; wherein the first doped region, the first gate structure and the second doped region are collaboratively formed as a first select transistor, the second doped region, the second gate structure and the third doped region are collaboratively formed as a first floating gate transistor, the first portion of the second gate structure and the fourth doped region are collaboratively formed as a first capacitor, and the second portion of the second gate structure and the third doped region are collaboratively formed as a second capacitor, wherein a first memory cell of the array structure comprises the first select transistor, the first floating gate transistor, the first capacitor and the second capacitor.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which:

FIG. 1A (prior art) is a schematic top view illustrating a conventional single-poly non-volatile memory cell;

FIG. 1B (prior art) is a schematic equivalent circuit diagram of the single-poly non-volatile memory cell as shown in FIG. 1A;

FIGS. 2A to 2F schematically illustrate the steps of a method of manufacturing a single-poly non-volatile memory cell according to a first embodiment of the present invention;

FIG. 2G is a schematic equivalent circuit diagram of the single-poly non-volatile memory cell according to the first embodiment of the present invention;

FIG. 3A is a bias voltage table illustrating the bias voltages for performing a program action, an erase action and two read actions on the memory cell according to the first embodiment of the present invention;

FIG. 3B is a schematic circuit diagram the operations of performing the program action on the memory cell according to the first embodiment of the present invention;

FIG. 3C is a schematic circuit diagram the operations of performing the erase action on the memory cell according to the first embodiment of the present invention;

FIG. 3D is a schematic circuit diagram the operations of performing a first read action on the memory cell according to the first embodiment of the present invention;

FIG. 3E is a schematic circuit diagram the operations of performing a second read action on the memory cell according to the first embodiment of the present invention;

DETAILED DESCRIPTION OF PREFERRED EMBODIMENTS

FIGS. 2A to 2F schematically illustrate the steps of a method of manufacturing a single-poly non-volatile memory cell according to a first embodiment of the present invention. FIG. 2G is a schematic equivalent circuit diagram of the single-poly non-volatile memory cell according to the first embodiment of the present invention. For brevity, the single-poly non-volatile memory cell is referred hereinafter as a memory cell.

Figure 2A:
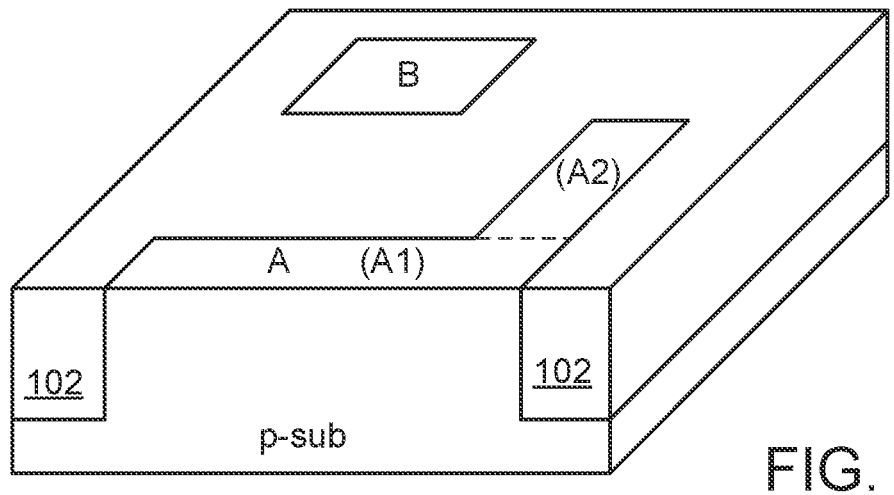

As shown in FIG. 2A, an isolation structure forming step is performed. Firstly, an isolation structure such as a shallow trench isolation (STI) structure 102 is formed on a p-type substrate (p-sub). Due to the STI structure 102, a region A and a region B are defined. The p-type substrate is covered by the STI structure 102. The surface of the p-type substrate corresponding to the region A and the region B is exposed. The region B is a rectangular region. The region A is composed of two rectangular sub-regions A1 and A2. In the subsequent steps, two serially-connected n-type transistors and an assist gate region are formed in the region A, and an erase gate region is formed in the region B.

Figure 2B:
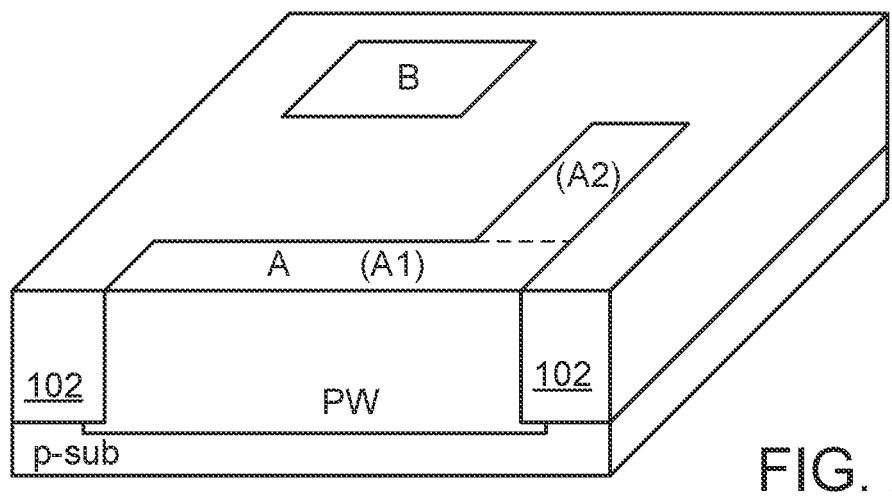

Then, a well region forming step is performed. As shown in FIG. 2B, the region A is exposed, and a P-well region PW is formed in the surface of the p-type substrate corresponding to the region A. In an embodiment, no well region is formed in the region B. It is noted that numerous modifications and alterations may be made while retaining the teachings of the invention. For example, in another embodiment, another P-well region (not shown) is formed in the surface of the p-type substrate corresponding to the region B. Alternatively, an N-well region (not shown) is formed in the surface of the p-type substrate corresponding to the region B.

Figure 2C:
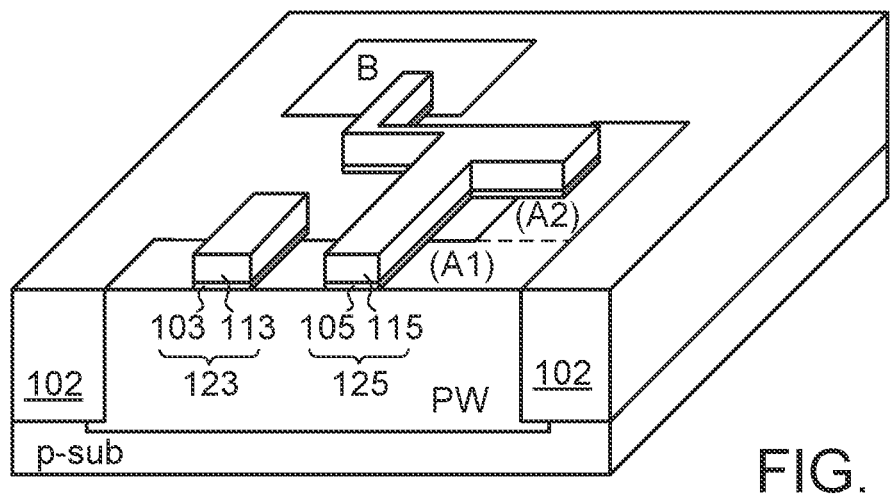

Then, a gate structure forming step is performed. As shown in FIG. 2C, two gate oxide layers 103 and 105 are formed. Then, two polysilicon gate layers 113 and 115 are formed on the two gate oxide layers 103 and 105, respectively. Consequently, two gate structures 123 and 125 are formed.

Please refer to FIG. 2C again. The two gate structures 123 and 125 are formed on the surface of the region A. In addition, the region A is divided into three sub-regions by the two gate structures 123 and 125. The gate structures 123 and 125 are formed on the surface corresponding to the sub-region A1. The first sub-region is located beside a left side of the gate structure 123. The second sub-region is arranged between the right side of the gate structure 123 and the left side of the gate structure 125. The third sub-region is located beside the right side of the gate structure 125 (including the sub-region A2). In other words, the third sub-region is an L-shaped sub-region.

Moreover, two extension segments are externally extended from the gate structure 125 through the surface of the STI structure 102. The first extension segment of the gate structure 125 is externally extended to the region B. In addition, a portion of the region B is covered by the first extension segment of the gate structure 125. The second extension segment of the gate structure 125 is externally extended to the sub-region A2 of the region A. In addition, a portion of the sub-region A2 is covered by the second extension segment of the gate structure 125. In this embodiment, the polysilicon gate layer 115 of the gate structure 125 is served as a floating gate. The polysilicon gate layer 113 of the gate structure 123 is served as a select gate.

Please refer to FIG. 2D. Then, a doped region forming step is performed. In an embodiment, a doping process is performed to form four n-type doped regions 141, 142, 143 and 145 by using the two gate structures 123 and 125 as the mask. That is, the n-type doped region 145 is formed in the portion of the region B that is not covered by the gate structure 125. In addition, the three n-type doped regions 141, 142 and 143 are respectively formed in the three sub-regions of the region A that are not covered by the two gate structures 123 and 125.

In the region A, the gate structure 123 and the two n-doped regions 141 and 142 on its two sides are collaboratively formed as a select transistor. In addition, the gate structure 125 and the two n-doped regions 142 and 143 on its two sides are collaboratively formed as a floating gate transistor. In this embodiment, the floating gate transistor and the select transistor are n-type transistors and constructed in the P-well region PW. That is, the body terminal of the floating gate transistor and the body terminal of the select transistor are connected to the P-well region PW.

The n-doped region 143 is a drain/source terminal of the floating transistor. In addition, the n-doped region 143 can be served as the assist gate region. That is, the second extension segment of the gate structure 125 is externally extended to a region beside the assist gate region. Consequently, the assist gate region and the gate structure 125 are collaboratively formed as an n-type transistor. In addition, the n-type transistor is connected as a MOS capacitor.

In the region B, the n-type doped region 145 is the erase gate region. The first extension segment of the gate structure 125 is externally extended to a region beside the erase gate region. Consequently, the erase gate region and the gate structure 125 are collaboratively formed as an n-type transistor. In addition, the n-type transistor is connected as another MOS capacitor.

Please refer to FIG. 2E. After a step of forming metal conductor lines is completed, the memory cell of this embodiment is fabricated. That is, the n-type doped region 141 is connected to a source line SL, the n-type doped region 143 is connected to a bit line BL, the n-type doped region 145 is connected to an erase line EL, and the polysilicon gate layer 113 is connected to a select gate line SG.

Due to a special structural design of the memory cell, the programming efficiency and the erasing efficiency are both enhanced. It is noted that the special structure design is not restricted. For example, as shown in FIG. 2F, there are two overlap regions $A_{MF}$ and $A_{AG}$ between the polysilicon gate layer 115 and the region A. The overlap region $A_{MF}$ is located under the polysilicon gate layer 115 and arranged between the n-type doped regions 142 and 143. In addition, the overlap region $A_{MF}$ is a channel region of the floating gate transistor (i.e., an active region of the floating gate transistor). The overlap region $A_{AG}$ is located in the third sub-region of region A under the polysilicon gate layer 115. Three sides of the overlap region $A_{AG}$ are next to the n-type doped region 143. In addition, the overlap region $A_{AG}$ is an active region of the assist gate region. Moreover, there is an overlap region $A_{EG}$ between the polysilicon gate layer 115 and the region B. The overlap region $A_{EG}$ is located in the region B under the polysilicon gate layer 115. In addition, three sides of the overlapping region $A_{EG}$ are next to the n-type doped region 145. The overlap region $A_{EG}$ is an active region of the erase gate region. The area $A_{AG}$ of the active region of the assist gate region is larger than the area $A_{EG}$ of the active region of the erase gate region (i.e., $A_{AG}>A_{EG}$) Moreover, the sum of the area $A_{AG}$ of the active region of the assist gate region and the area $A_{EG}$ of the active region of the erase gate region is larger than the area $A_{MF}$ of the active region of the floating gate transistor. That is, $(A_{AG}+A_{EG})>A_{MF}$.

Moreover, due to the special structural design of the memory cell, the size of the memory cell is reduced. For example, as shown in FIG. 2F, the channel region of the floating gate transistor is extended in a w-x direction (e.g., in a horizontal direction). The second extension segment of the polysilicon gate layer 115 (or the gate structure 125) is extended in a y-z direction (e.g., in the horizontal direction). In other words, the second extension segment of the polysilicon gate layer 115 is extended in the same direction as the channel region of the floating gate transistor.

As shown in FIG. 2G, the equivalent circuit of the memory cell of the first embodiment comprises a select transistor $M_S$, a floating gate transistor $M_F$, a capacitor $C_{EG}$ and a capacitor $C_{AG}$. Moreover, the capacitor $C_{EG}$ and the capacitor $C_{AG}$ are MOS capacitors.

The gate terminal of the select transistor $M_S$ is connected to a select gate line SG. The first drain/source terminal of the select transistor $M_S$ is connected to the source line SL. The first drain/source terminal of the floating gate transistor $M_F$ is connected to the second drain/source terminal of the select transistor $M_S$. The second drain/source terminal of the floating gate transistor $M_F$ is connected to the bit line BL. The first terminal of the capacitor $C_{EG}$ is connected to the floating gate 115 of the floating gate transistor $M_F$. The second terminal of the capacitor $C_{EG}$ is connected to the erase line EL. The first terminal of the capacitor $C_{AG}$ is connected to the floating gate 115 of the floating gate transistor $M_F$. The second terminal of the capacitor $C_{AG}$ is connected to the bit line BL.

As mentioned above, the memory cell of the present invention comprises the assist gate region and the erase gate region. In comparison with the memory cell as shown in FIG. 1A, the memory cell of the present invention is a four-terminal memory cell. In addition, the size of the memory cell of the present invention is smaller.

FIG. 3A is a bias voltage table illustrating the bias voltages for performing a program action, an erase action and two read actions on the memory cell according to the first embodiment of the present invention. FIG. 3B is a schematic circuit diagram the operations of performing the program action on the memory cell according to the first embodiment of the present invention. FIG. 3C is a schematic circuit diagram the operations of performing the erase action on the memory cell according to the first embodiment of the present invention. FIG. 3D is a schematic circuit diagram the operations of performing a first read action on the memory cell according to the first embodiment of the present invention. FIG. 3E is a schematic circuit diagram the operations of performing a second read action on the memory cell according to the first embodiment of the present invention.

While the program action (PGM), the erase action (ERS) and the two read actions (Read_1 and Read_2) are performed, the P-well region PW receives a ground voltage (0V). Moreover, the erase voltage $V_{EE}$ is higher than the program voltage $V_{PP}$, the program voltage $V_{PP}$ is higher than the read voltage $V_R$, and the read voltage $V_R$ is higher than the ground voltage (0V). For example, the erase voltage $V_{EE}$ is 12V, the program voltage $V_{PP}$ is 9V, and the read voltage $V_R$ is 5V.

Please refer to FIG. 3B. While the program action is performed, the bit line BL receives a program voltage $V_{PP}$, the source line SL receives the ground voltage (0V), the select gate line SG receives the program voltage $V_{PP}$, and the erase line EL receives a voltage between the ground voltage (0V) and the erase voltage $V_{EE}$.

While the program action is performed, the select transistor $M_S$ is turned on, and a program current $I_P$ is generated between the bit line BL and the source line SL. Therefore, when the hot carriers (e.g. electrons) in the program current $I_P$ pass through the channel region of the floating gate transistor $M_F$, a channel hot electron injection effect (CHE effect) is generated and the hot carriers are injected into the floating gate 115. Furthermore, the capacitor $C_{AG}$ may couple the program voltage $V_{PP}$ received by the bit line BL to the floating gate 115, so that the number of hot carriers injected into the floating gate 115 can be increased to improve the program efficiency.

Please refer to FIG. 3C. While the erase action is performed, the bit line BL receives the ground voltage (0V), the source line SL receives the ground voltage (0V), the select gate line SG receives the ground voltage (0V), and the erase line EL receives the erase voltage $V_{EE}$.

While the erase action is performed, the select transistor $M_S$ is turned off. Under this circumstance, a Fowler-Nordheim Tunneling (FN) effect is generated between the two terminals of the transistor $C_{EG}$. Consequently, hot carriers are ejected from the floating gate 115 to the erase line EL.

Please refer to FIG. 3D. While the first read action is performed, the bit line BL receives the read voltage $V_R$, the source line SL receives the ground voltage (0V), the select gate line SG receives the read voltage $V_R$, and the erase line EL receives a voltage between the ground voltage (0V) and the erase voltage $V_{EE}$.

While the first read action is performed, the select transistor $M_S$ is turned on, and the read current $I_R$ is generated between the bit line BL and the source line SL. The read current $I_R$ flows from the bit line BL to the source line SL. The storage state of the memory cell can be determined according to the magnitude of the read current $I_R$. For example, in case that the electrons are stored in the floating gate 115, the magnitude of the read current $I_R$ is very low (e.g., nearly zero). Consequently, it is determined that the memory cell is in a first storage state. Whereas, in case that no electrons are stored in the floating gate 115, the magnitude of the read current $I_R$ is high. Under this circumstance, it is determined that the memory cell is in a second storage state.

Please refer to FIG. 3E. While the second read action is performed, the source line SL receives the read voltage $V_R$, the bit line BL receives the ground voltage (0V), the select gate line SG receives the read voltage $V_R$, and the erase line EL receives a voltage between the ground voltage (0V) and the erase voltage $V_{EE}$.

While the second read action is performed, the select transistor $M_S$ is turned on, and the read current $I_R$ is generated between the bit line BL and the source line SL. The read current $I_R$ flows from the source line SL to the source line BL. The storage state of the memory cell can be determined according to the magnitude of the read current $I_R$. For example, in case that the electrons are stored in the floating gate 115, the magnitude of the read current $I_R$ is very low (e.g., nearly zero). Consequently, it is determined that the memory cell is in the first storage state. Whereas, in case that no electrons are stored in the floating gate 115, the magnitude of the read current $I_R$ is very high. Under this circumstance, it is determined that the memory cell is in the second storage state.

Figure 4A:
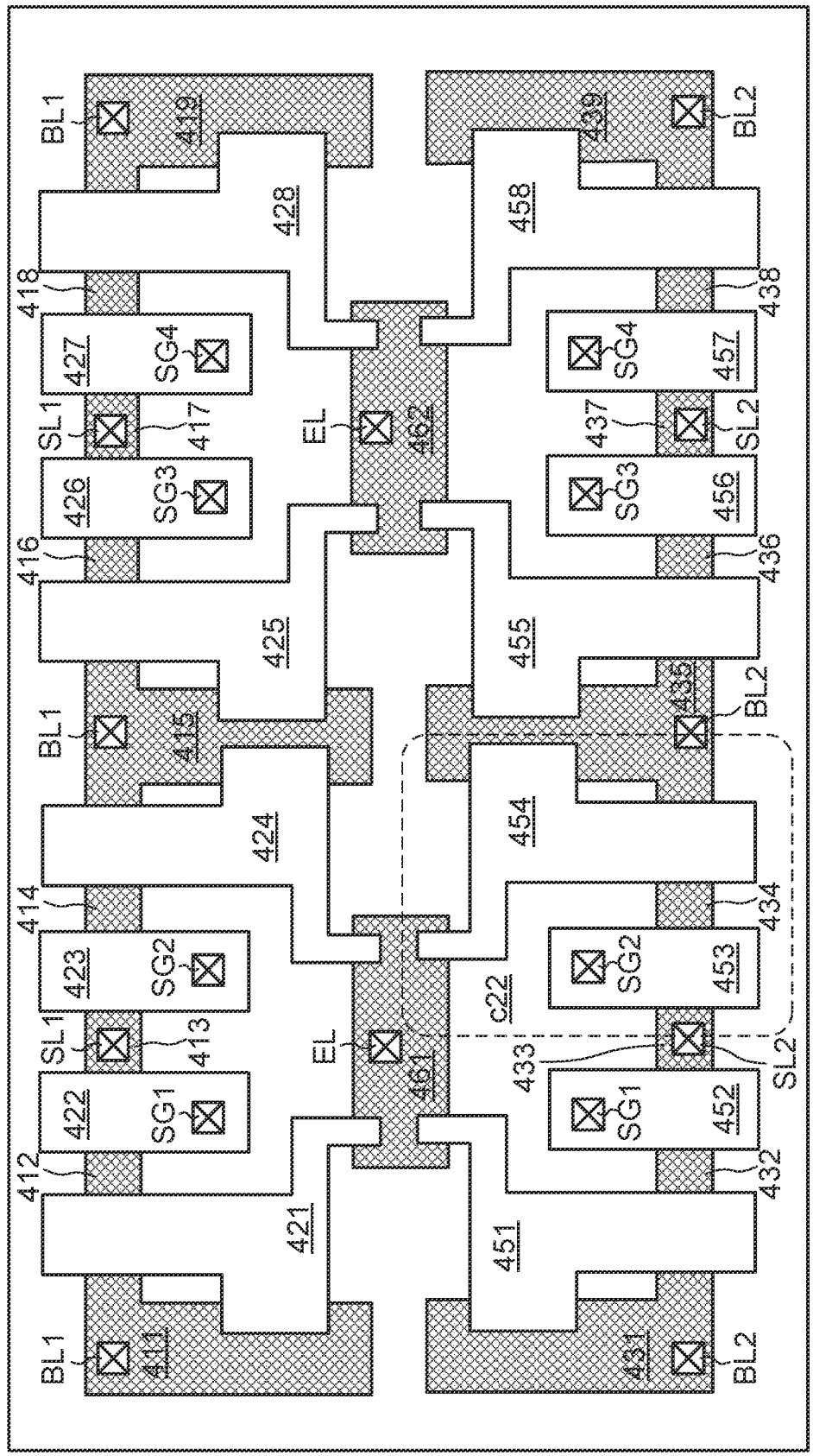
FIG. 4A is a schematic top view illustrating an array structure of with plural memory cells of the first embodiment.
Figure 4B:
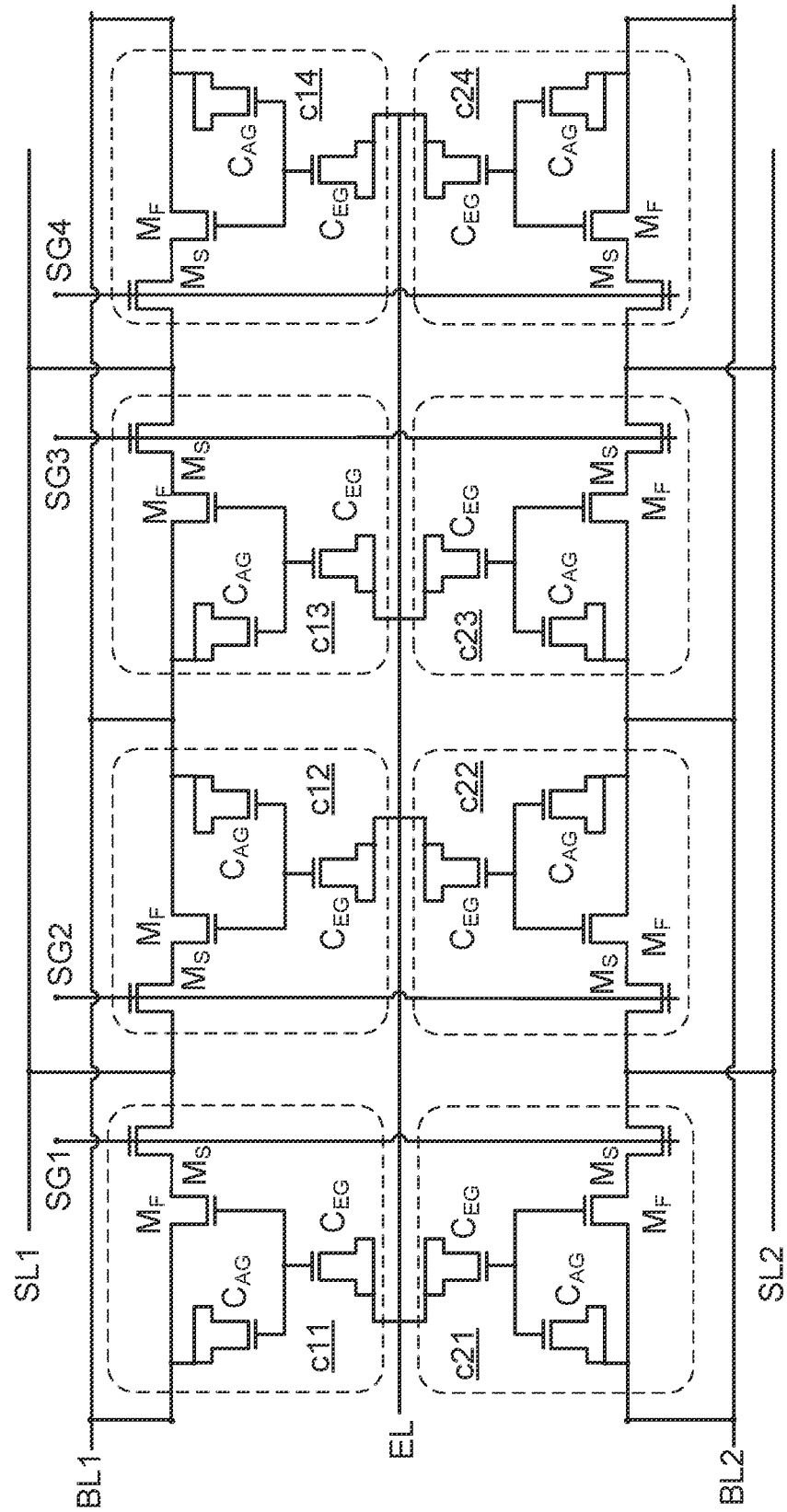
FIG. 4B is a schematic circuit diagram illustrating the equivalent circuit of the array structure as shown in FIG. 4A.

Moreover, plural memory cells can be collaboratively formed as an array structure. FIG. 4A is a schematic top view illustrating an array structure of with plural memory cells of the first embodiment. FIG. 4B is a schematic circuit diagram illustrating the equivalent circuit of the array structure as shown in FIG. 4A. The array structure comprises eight memory cells in a 2×4 array. The array structure is connected to the source lines SL1, SL2, the select gate lines SG1, SG2, SG3, SG4, the bit lines BL1, BL2, and the erase line EL. The array structure comprises plural n-type doped regions 411~419, 431~439, 461~462 and plural polysilicon gate layers 421~428, 451~458.

In some embodiments, in order to perform the first read action described in FIG. 3D, the source lines SL1 and SL2 in FIG. 4B can be connected to each other. In some other embodiments, in order to perform the second read action described in FIG. 3E, the bit lines BL1 and BL2 in FIG. 4B can be connected to each other.

The structure of each memory cell is similar to that of FIG. 2E. For succinctness, only the structure of the memory cell c22 will be described as follows, and the structures of the other memory cells are not redundantly described herein. In the memory cell c22 shown in FIG. 4A, the polysilicon gate layer 453 and the two n-doped regions 433 and 434 are collaboratively formed as a select transistor, and the polysilicon gate layer 454 and the two n-doped regions 434 and 435 are collaboratively formed as a floating gate transistor. The polysilicon gate layer 454 and the n-doped region 461 are collaboratively formed as an n-type transistor, and the n-type transistor is connected as a MOS transistor. In addition, the polysilicon gate layer 454 and the n-doped region 435 are collaboratively formed as an n-type transistor, and the n-type transistor is connected as another MOS transistor.

The n-type doped region 433 is connected to the source line SL2. The n-type doped region 435 is connected to the bit line BL2. The polysilicon gate layer 453 is connected to the select gate line SG2. The n-type doped region 461 is connected to the erase line EL.

The equivalent circuit of the array structure is shown in FIG. 4B. The array structure comprises four memory cells c11~c24 in a 2×4 array. The structures of these memory cells c11~c24 are identical. For succinctness, only the structure of the memory cell c11 will be described as follows, and the structures of the other memory cells are not redundantly described herein.

The connecting relationships between associated components of the memory cells c11 will be described as follows. The first drain/source terminal of the select transistor $M_S$ is connected to the source line SL1. The gate terminal of the select transistor $M_S$ is connected to the select gate line SG1. The first drain/source terminal of the floating gate transistor $M_F$ is connected to the second drain/source terminal of the select transistor $M_S$. The second drain/source terminal of the floating gate transistor $M_F$ is connected to the bit line BL1. The first terminal of the capacitor $C_{EG}$ is connected to the floating gate of the floating gate transistor $M_F$. The second terminal of the capacitor $C_{EG}$ is connected to the erase line EL. The first terminal of the capacitor $C_{AG}$ is connected to the floating gate of the floating gate transistor $M_F$. The second terminal of the capacitor $C_{AG}$ is connected to the bit line BL1.

Similarly, by providing proper bias voltages to the source lines SL1, SL2, the select gate lines SG1, SG2, SG3, SG4, the bit lines BL1, BL2, and the erase line EL, a program action, an erase action or a read action can be selectively performed on the memory cells c11~c24 of the array structure. The magnitudes of the bias voltages are similar to those described in FIG. 3A.

In the embodiment, the transistors of the memory cell are n-type transistors. It is noted that numerous modifications and alterations may be made while retaining the teachings of the invention. For example, in another embodiment, the n-type transistors are replaced by p-type transistors. In addition, the memory cell and the array structure with the p-type transistors can be implemented according to the teachings of the embodiment.

FIGS. 5A to 5E schematically illustrate the steps of a method of manufacturing a single-poly non-volatile memory cell according to a second embodiment of the present invention.

Figure 5A:
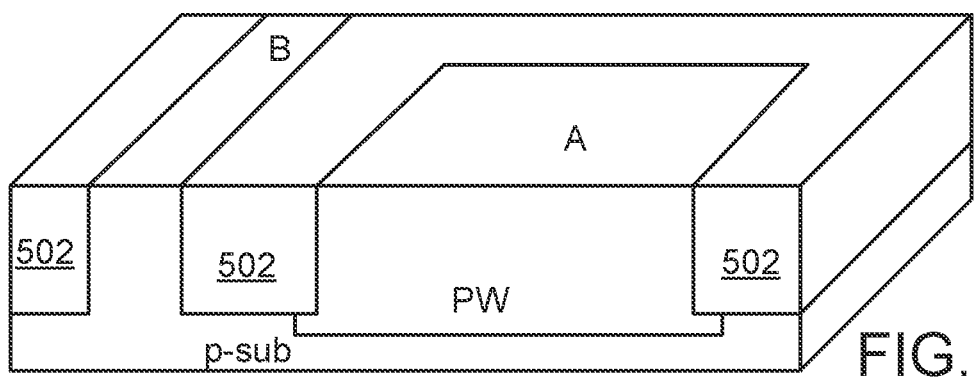
FIGS. 5A to 5E schematically illustrate the steps of a method of manufacturing a single-poly non-volatile memory cell according to a second embodiment of the present invention.

As shown in FIG. 5A, an isolation structure forming step is performed. Firstly, an isolation structure such as a shallow trench isolation (STI) structure 502 is formed on a p-type substrate (p-sub). Due to the STI structure 502, a region A and a region B are defined. The p-type substrate is covered by the STI structure 502. The surface of the p-type substrate corresponding to the region A and the region B is exposed. In the subsequent steps, two serially-connected n-type transistors and an assist gate region are formed in the region A, and an erase gate region is formed in the region B.

Then, a well region forming step is performed. As shown in FIG. 5A, the region A is exposed, and a P-well region PW is formed in the surface of the p-type substrate corresponding to the region A. In an embodiment, no well region is formed in the region B. It is noted that numerous modifications and alterations may be made while retaining the teachings of the invention. For example, in another embodiment, another P-well region (not shown) is formed in the surface of the p-type substrate corresponding to the region B. Alternatively, an N-well region (not shown) is formed in the surface of the p-type substrate corresponding to the region B.

Figure 5B:
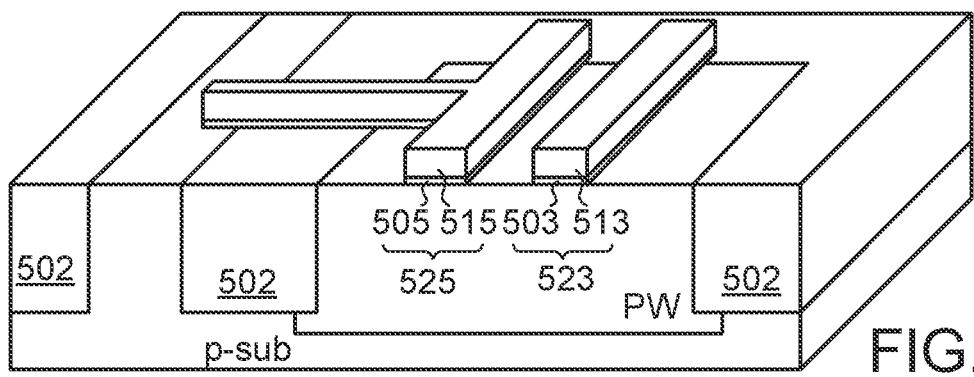

Then, a gate structure forming step is performed. As shown in FIG. 5B, two gate oxide layers 503 and 505 are formed. Then, two polysilicon gate layers 513 and 515 are formed on the two gate oxide layers 503 and 505, respectively. Consequently, two gate structures 523 and 525 are formed.

Please refer to FIG. 5B again. The two gate structures 523 and 525 are formed on the surface of the region A. In addition, the region A is divided into four sub-regions by the two gate structures 523 and 525. The first sub-region is located beside a right side of the gate structure 523. The second sub-region is arranged between the left side of the gate structure 523 and the right side of the gate structure 525. The third sub-region and the fourth sub-region are located beside two sides of the extension segment of the gate structure 525.

In this embodiment, the polysilicon gate layer 515 of the gate structure 525 is served as a floating gate. The polysilicon gate layer 513 of the gate structure 523 is served as a select gate.

Figure 5C:
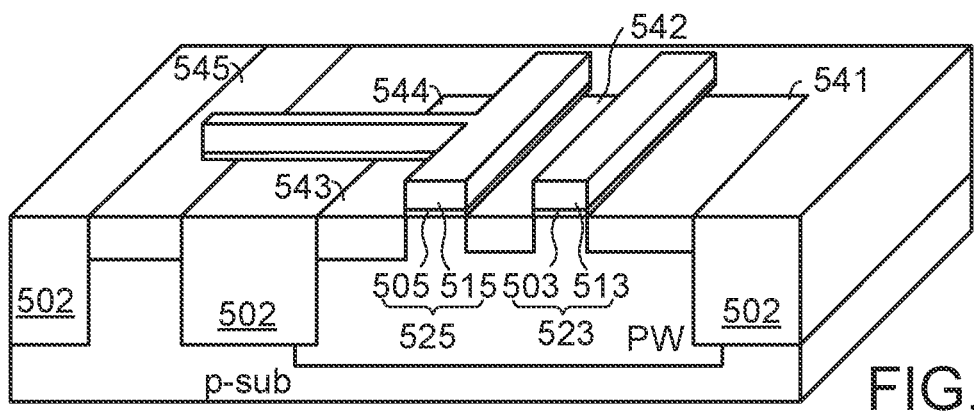

Please refer to FIG. 5C. Then, a doped region forming step is performed. In an embodiment, a doping process is performed to form five n-type doped regions 541, 542, 543, 544 and 545 by using the two gate structures 523 and 525 as the mask. That is, the n-type doped region 545 is formed in the portion of the region B that is not covered by the gate structure 525. In addition, the four n-type doped regions 541, 542, 543 and 544 are respectively formed in the four sub-regions of the region A that are not covered by the two gate structures 523 and 525.

In the region A, the gate structure 523 and the two n-doped regions 541 and 542 on its two sides are collaboratively formed as a select transistor. In addition, the gate structure 525 and the two n-doped regions 542 and 543 on its two sides are collaboratively formed as a floating gate transistor. In this embodiment, the floating gate transistor and the select transistor are n-type transistors and constructed in the P-well region PW. That is, the body terminal of the floating gate transistor and the body terminal of the select transistor are connected to the P-well region PW.

The n-doped region 543 is a drain/source terminal of the floating transistor. In addition, the n-doped region 543 can be served as the assist gate region. That is, the extension segment of the gate structure 525 is extended to a region beside the assist gate region. Consequently, the assist gate region and the gate structure 525 are collaboratively formed as an n-type transistor. In addition, the n-type transistor is connected as a MOS capacitor.

In the region B, the n-type doped region 545 is the erase gate region. The extension segment of the gate structure 525 is externally extended to a region beside the erase gate region. Consequently, the erase gate region and the gate structure 525 are collaboratively formed as an n-type transistor. In addition, the n-type transistor is connected as another MOS capacitor.

It is noted that the extension segment of the gate structure 525 can also be designed to cover the A region and is extended to the B region along the edge of the A region in another embodiment. Therefore, the area A is divided into three sub-regions. In addition, after the doped region forming step, only three n-type doped regions 541, 542, 543 are formed, and there is no n-doped region 544 in FIG. 5C.

Figure 5D:
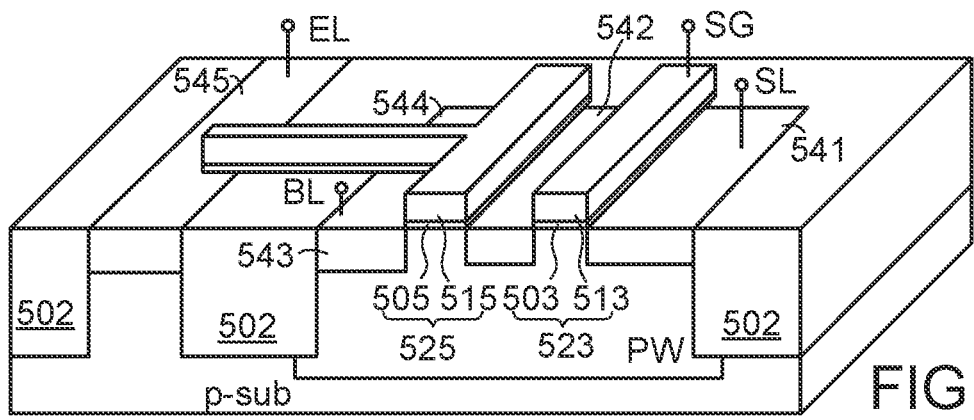

Please refer to FIG. 5D. After a step of forming metal conductor lines is completed, the memory cell of this embodiment is fabricated. That is, the n-type doped region 541 is connected to a source line SL, the n-type doped region 543 is connected to a bit line BL, the n-type doped region 545 is connected to an erase line EL, and the polysilicon gate layer 513 is connected to a select gate line SG.

The equivalent circuit of the memory cell of the second embodiment is a four-terminal memory cell. Furthermore, the equivalent circuit is similar to that of FIG. 2G and is not redundantly described herein.

Figure 5E:
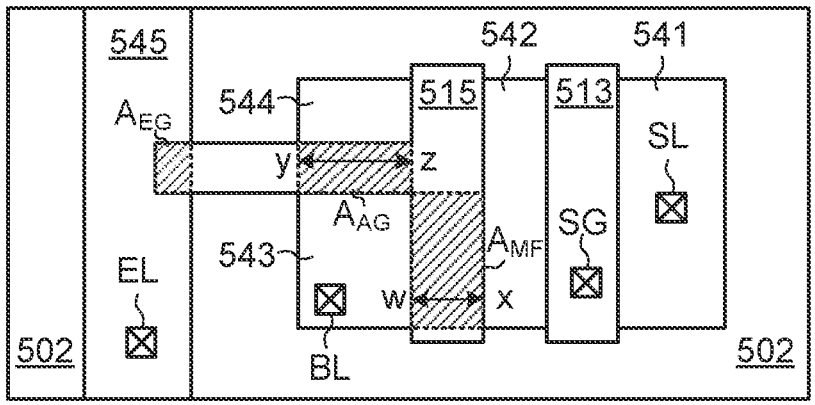

Due to a special structural design of the memory cell, the programming efficiency and the erasing efficiency are both enhanced. It is noted that the special structure design is not restricted. For example, as shown in FIG. 5E, there are two overlap regions $A_{MF}$ and $A_{AG}$ between the polysilicon gate layer 515 and the region A. The overlap region $A_{MF}$ is located under the polysilicon gate layer 515 and arranged between the n-type doped regions 542 and 543. In addition, the overlap region $A_{MF}$ is a channel region of the floating gate transistor (i.e., an active region of the floating gate transistor). The overlap region $A_{AG}$ is located under the extension segment of the polysilicon gate layer 515 and arranged between the n-type doped regions 543 and 544. In addition, the overlap region $A_{AG}$ is an active region of the assist gate region. Moreover, there is an overlap region $A_{EG}$ in the region B under the polysilicon gate layer 515. In addition, three sides of the overlapping region $A_{EG}$ are next to the n-type doped region 545. The overlap region $A_{EG}$ is an active region of the erase gate region. The area $A_{AG}$ of the active region of the assist gate region is larger than the area $A_{EG}$ of the active region of the erase gate region (i.e., $A_{AG} > A_{EG}$). Moreover, the sum of the area $A_{AG}$ of the active region of the assist gate region and the area $A_{EG}$ of the active region of the erase gate region is larger than the area $A_{MF}$ of the active region of the floating gate transistor. That is, $(A_{AG} + A_{EG}) > A_{MF}$.

Moreover, due to the special structural design of the memory cell, the size of the memory cell is reduced. For example, as shown in FIG. 5E, the channel region of the floating gate transistor is extended in a w-x direction (e.g., in a horizontal direction). The extension segment of the polysilicon gate layer 115 (or the gate structure 125) is extended in a y-z direction (e.g., in the horizontal direction). In other words, the extension segment of the polysilicon gate layer 515 is extended in the same direction as the channel region of the floating gate transistor.

Figure 6A:
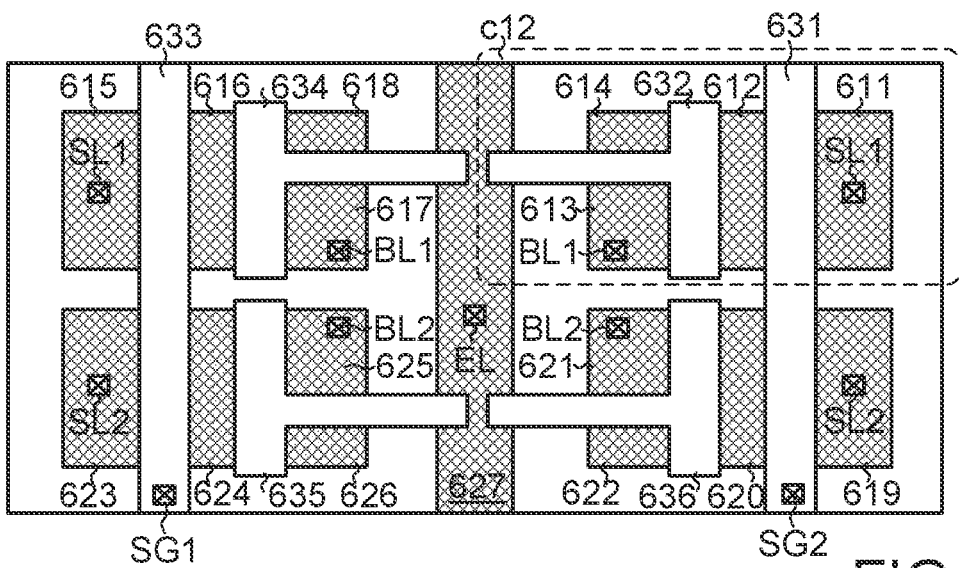
FIG. 6A is a schematic top view illustrating an array structure of with plural memory cells of the second embodiment.
Figure 6B:
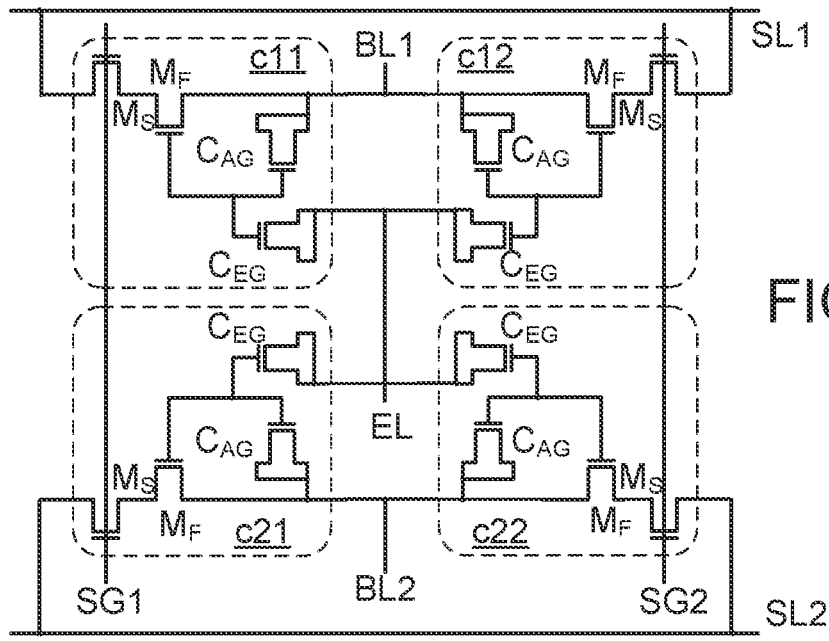
FIG. 6B is a schematic circuit diagram illustrating the equivalent circuit of the array structure as shown in FIG. 6A.

Moreover, plural memory cells can be collaboratively formed as an array structure. FIG. 6A is a schematic top view illustrating an array structure of with plural memory cells of the second embodiment. FIG. 6B is a schematic circuit diagram illustrating the equivalent circuit of the array structure as shown in FIG. 6A. The array structure comprises four memory cells in a 2×2 array. The array structure is connected to the source lines SL1, SL2, the select gate lines SG1, SG2, the bit lines BL1, BL2, and the erase line EL. The array structure comprises plural n-type doped regions 611~627 and plural polysilicon gate layers 631~636.

The structure of each memory cell is similar to that of FIG. 5E. For succinctness, only the structure of the memory cell c12 will be described as follows, and the structures of the other memory cells are not redundantly described herein. In the memory cell c12, the polysilicon gate layer 631 and the two n-doped regions 611 and 612 are collaboratively formed as a select transistor, and the polysilicon gate layer 632 and the two n-doped regions 612 and 613 are collaboratively formed as a floating gate transistor. The polysilicon gate layer 632 and the n-doped region 627 are collaboratively formed as an n-type transistor, and the n-type transistor is connected as a MOS transistor. In addition, the polysilicon gate layer 632 and the n-doped region 613 are collaboratively formed as an n-type transistor, and the n-type transistor is connected as another MOS transistor.

The n-type doped region 611 is connected to the source line SL1. The n-type doped region 613 is connected to the bit line BL1. The polysilicon gate layer 631 is connected to the select gate line SG2. The n-type doped region 627 is connected to the erase line EL.

The equivalent circuit of the array structure is shown in FIG. 6B. The array structure comprises four memory cells c11~c22 in a 2×2 array. The structures of these memory cells c11~c22 are identical. For succinctness, only the structure of the memory cell c11 will be described as follows, and the structures of the other memory cells are not redundantly described herein.

The connecting relationships between associated components of the memory cells c11 will be described as follows. The first drain/source terminal of the select transistor $M_S$ is connected to the source line SL1. The gate terminal of the select transistor $M_S$ is connected to the select gate line SG1. The first drain/source terminal of the floating gate transistor $M_F$ is connected to the second drain/source terminal of the select transistor $M_S$. The second drain/source terminal of the floating gate transistor $M_F$ is connected to the bit line BL1. The first terminal of the capacitor $C_{EG}$ is connected to the floating gate of the floating gate transistor $M_F$. The second terminal of the capacitor $C_{EG}$ is connected to the erase line EL. The first terminal of the capacitor $C_{AG}$ is connected to the floating gate of the floating gate transistor $M_F$. The second terminal of the capacitor $C_{AG}$ is connected to the bit line BL1.

Similarly, by providing proper bias voltages to the source lines SL1, SL2, the select gate lines SG1, SG2, the bit lines BL1, BL2, and the erase line EL, a program action, an erase action or a read action can be selectively performed on the memory cells c11~c22 of the array structure. The magnitudes of the bias voltages are similar to those described in FIG. 3A and FIG. 4B.

In some embodiments, in order to perform the first read action described in FIG. 3D, the source lines SL1 and SL2 in FIG. 6B can be connected to each other. In some other embodiments, in order to perform the second read action described in FIG. 3E, the bit lines BL1 and BL2 in FIG. 6B can be connected to each other.

Figure 7:
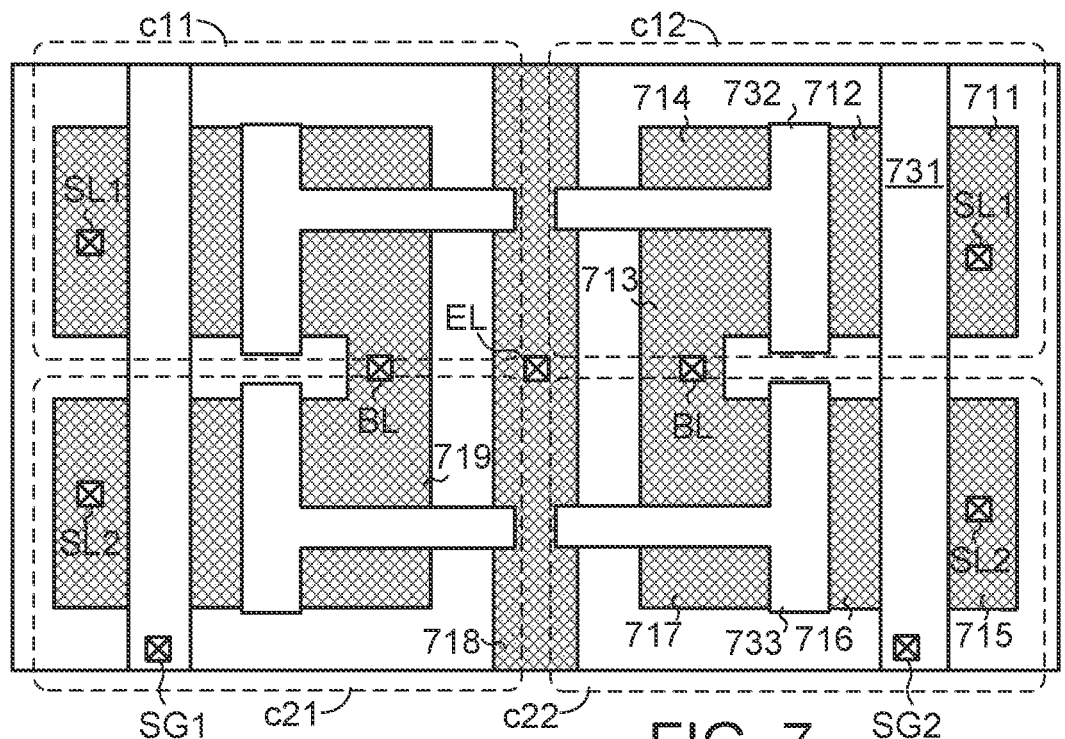
FIG. 7 is a schematic top view illustrating a single-poly non-volatile memory cell of the third embodiment and an associated array structure of with plural memory cells.

FIG. 7 is a schematic top view illustrating a single-poly non-volatile memory cell of the third embodiment and an associated array structure of with plural memory cells. The array structure comprises plural n-type doped regions 711~719 and plural polysilicon gate layers 731~733. The memory cell of the third embodiment is similar to the memory cell of the second embodiment.

In FIG. 6A, the n-doped region 613 of the memory cell c12 of the second embodiment is connected with the n-doped region 617 of the adjacent memory cell by a metal conductor line BL1. In comparison with the second embodiment in FIG. 6A, the memory cell c12 of the third embodiment shares the n-doped region 713 with the memory cell c22 in FIG. 7, the memory cell c11 of the third embodiment shares the n-doped region 719 with the memory cell c21 in FIG. 7, and both the n-doped region 713, 719 are connected with the metal conductor line BL.

The equivalent circuit of the memory cell of the third embodiment is similar to the equivalent circuit of the memory cell of the second embodiment and is not redundantly described herein. Moreover, the equivalent circuit of the array structure of FIG. 7 is similar to the array structure shown in FIG. 6B and is not redundantly described herein.

Similarly, by providing proper bias voltages to the source lines SL1, SL2, the select gate lines SG1, SG2, the bit line BL, and the erase line EL, a program action, an erase action or a read action can be selectively performed on the memory cells c11~c22 of the array structure in FIG. 7. The magnitudes of the bias voltages are similar to those described in FIG. 3A. Since the memory cells c11~c22 of the array structure are connected to the bit line BL, the total size of the array structure in FIG. 7 can be reduced and only the second read action described in FIG. 3E can be performed on the array structure.

Figure 8A:
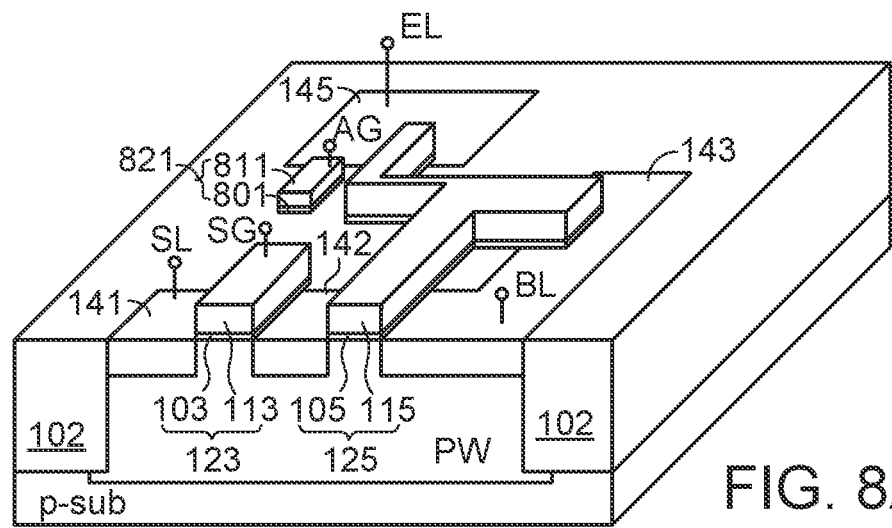
FIG. 8A is a single-poly non-volatile memory cell according to a fourth embodiment of the present invention.
Figure 8B:
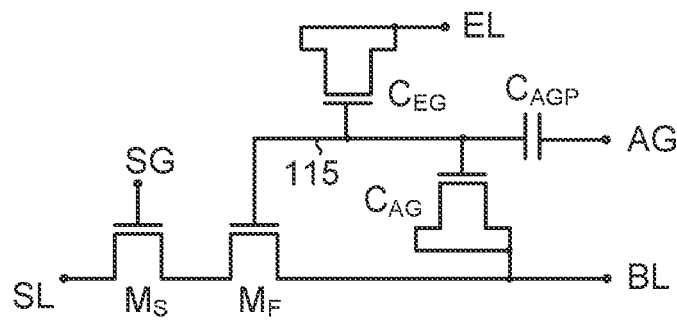
FIG. 8B is a schematic equivalent circuit diagram of the single-poly non-volatile memory cell according to the fourth embodiment of the present invention.
Figures 8C, 9:
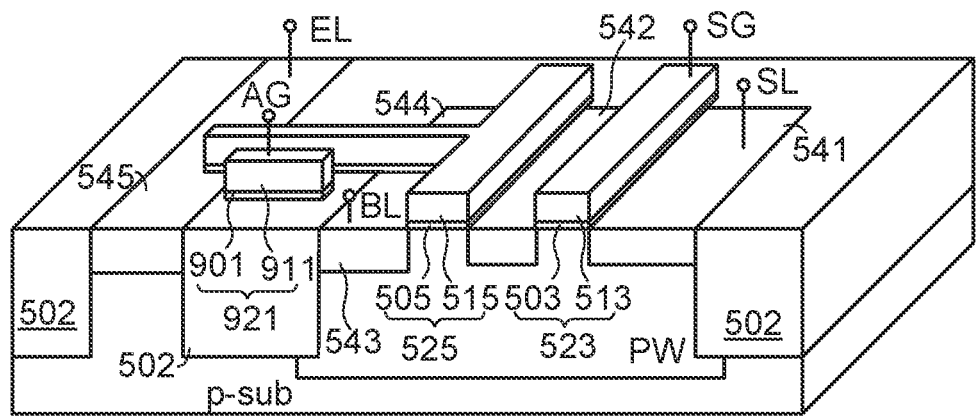
FIG. 8C is a bias voltage table illustrating the bias voltages for performing a program action, an erase action and two read actions on the memory cell according to the fourth embodiment of the present invention.
FIG. 9 is a single-poly non-volatile memory cell according to a fifth embodiment of the present invention.

FIG. 8A illustrates a single-poly non-volatile memory cell according to a fourth embodiment of the present invention. FIG. 8B is a schematic equivalent circuit diagram of the single-poly non-volatile memory cell according to the fourth embodiment of the present invention. FIG. 8C is a bias voltage table illustrating the bias voltages for performing a program action, an erase action and two read actions on the memory cell according to the fourth embodiment of the present invention.

In comparison with memory cell of the first embodiment in FIG. 2E, the memory cell of the fourth embodiment shown in FIG. 8A further comprises a gate structure 821 formed on the STI structure 102 and the gate structure 821 is located beside one side of the gate structure 125. The gate structure 821 includes a gate oxide layer 801 formed on the surface of the STI structure 102 and a polysilicon gate layer 811 formed on the gate oxide layer 801. Furthermore, the polysilicon gate layer 811 is connected with an assist gate line AG. Also, the polysilicon gate layer 811 and the polysilicon gate layer 115 are collaboratively formed as a poly/poly plate capacitor.

As shown in FIG. 8B, the first terminal of the poly/poly plate capacitor $C_{AGP}$ is connected to the floating gate 115 of the floating gate transistor $M_F$ and the second terminal of the poly/poly plate capacitor $C_{AGP}$ is connected to the assist gate line AG.

In comparison with the bias voltage table in FIG. 3A, the bias table in FIG. 8C further comprises a bias voltage for the assist gate line AG. For succinctness, only the bias voltage on the assist gate line AG will be described as follows, and the other bias voltages are not redundantly described herein.

While the program action (PGM) is performed, the assist gate line AG receives a voltage between the ground voltage (0V) and a positive assist gate voltage $V_{AG}$. While the erase action (ERS) is performed, the assist gate line AG receives a voltage between a negative assist gate voltage $-V_{AG}$ and the ground voltage (0V). While the first read action or the second read action is performed, the assist gate line AG receives a voltage between the negative assist gate voltage $-V_{AG}$ and the positive assist gate voltage $V_{AG}$. For example, the positive assist gate voltage $V_{AG}$ is 10V.

FIG. 9 illustrates a single-poly non-volatile memory cell according to a fifth embodiment of the present invention.

In comparison with memory cell of the second embodiment in FIG. 5D, the memory cell of the fifth embodiment shown in FIG. 9 further comprises a gate structure 921 formed on the STI structure 502 and the gate structure 921 is located beside one side of the gate structure 525. The gate structure 921 includes a gate oxide layer 901 formed on the surface of the STI structure 502 and a polysilicon gate layer 911 formed on the gate oxide layer 901. Furthermore, the polysilicon gate layer 911 is connected with the assist gate line AG. Also, the polysilicon gate layer 911 and the polysilicon gate layer 515 are collaboratively formed as a poly/poly plate capacitor. In some embodiment, the gate structure 921 can be shared with the adjacent cell in a memory array.

The equivalent circuit of the memory cell of the fifth embodiment is identical to the equivalent circuit of the memory cell of the fourth embodiment shown in FIG. 8B. Moreover, the bias voltages for the program action, erase action and read action are similar to those described in FIG. 8C. and is not redundantly described herein.

From the above descriptions, the present invention provides an erasable programmable single-poly non-volatile memory cell and an associated array structure. The memory cell comprises a select transistor and a floating gate transistor. The floating gate of the floating gate transistor and an assist gate region are collaboratively formed as a capacitor. The floating gate of the floating gate transistor and an erase gate region are collaboratively formed as another capacitor. Moreover, the select transistor, the floating gate transistor and the two capacitors are collaboratively formed as a four-terminal memory cell. Consequently, the size of the memory cell is small, and the memory cell is operated more easily.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An array structure of erasable programmable non-volatile memory cells, the array structure being constructed in a semiconductor substrate, the array structure comprising:
    an isolation structure formed on the semiconductor substrate, wherein a surface of the semiconductor substrate is divided into a first region and a second region by the isolation structure;
    a well region formed in the surface of the semiconductor substrate corresponding to the first region;
    a first gate structure and a second gate structure formed on the surface of the semiconductor substrate corresponding to the first region, wherein the first region is divided into a first sub-region, a second sub-region and a third sub-region by the first gate structure and the second gate structure, wherein the first sub-region is located beside a first side of the first gate structure, the second sub-region is arranged between a second side of the first gate structure and a first side of the second gate structure, and the third sub-region is located beside a second side of the second gate structure, wherein the first gate structure is connected to a first select gate line, an extension segment of the second gate structure is externally extended from the second gate structure through a surface of the isolation structure, a portion of the second region is covered by a first portion of the second gate structure, and a portion of the third sub-region is covered by a second portion of the second gate structure;
    a first doped region, a second doped region and a third doped region formed in the surface of the semiconductor substrate corresponding to the first sub-region, the second sub-region and the third sub-region, respectively, wherein the first doped region is connected to a first source line, and the third doped region is connected to a first bit line; and a fourth doped region formed in the surface of the semiconductor substrate corresponding to the second region, wherein the fourth doped region is connected to an erase line;

wherein the first doped region, the first gate structure and the second doped region are collaboratively formed as a first select transistor, the second doped region, the second gate structure and the third doped region are collaboratively formed as a first floating gate transistor, the first portion of the second gate structure and the fourth doped region are collaboratively formed as a first capacitor, and the second portion of the second gate structure and the third doped region are collaboratively formed as a second capacitor, wherein a first memory cell of the array structure comprises the first select transistor, the first floating gate transistor, the first capacitor and the second capacitor.

2. The array structure as claimed in claim 1, wherein in the first memory cell, a gate terminal of the first select transistor is connected to the first select gate line, a first drain/source terminal of the first select transistor is connected to the first source line, a first drain/source terminal of the first floating gate transistor is connected to a second drain/source terminal of the first select transistor, a second drain/source terminal of the first floating gate transistor is connected to the first bit line, a first terminal of the first capacitor is connected to a floating gate of the first floating gate transistor, a second terminal of the first capacitor is connected to the erase line, a first terminal of the second capacitor is connected to the floating gate of the first floating gate transistor, and a second terminal of the second capacitor is connected to the first bit line.

3. The array structure as claimed in claim 2, wherein the array structure further comprises a second memory cell, wherein the second memory cell comprises a second select transistor, a second floating gate transistor, a third capacitor and a fourth capacitor, wherein a gate terminal of the second select transistor is connected to the first select line, a first drain/source terminal of the second select transistor is connected to a second source line, a first drain/source terminal of the second floating gate transistor is connected to a second drain/source terminal of the second select transistor, a second drain/source terminal of the second floating gate transistor is connected to a second bit line, a first terminal of the third capacitor is connected to a floating gate of the second floating gate transistor, a second terminal of the third capacitor is connected to the erase line, a first terminal of the fourth capacitor is connected to the floating gate of the second floating gate transistor, and a second terminal of the fourth capacitor is connected to the second bit line.

4. The array structure as claimed in claim 2, wherein the array structure further comprises a second memory cell, wherein the second memory cell comprises a second select transistor, a second floating gate transistor, a third capacitor and a fourth capacitor, wherein a gate terminal of the second select transistor is connected to a second select gate line, a first drain/source terminal of the second select transistor is connected to the first source line, a first drain/source terminal of the second floating gate transistor is connected to a second drain/source terminal of the second select transistor, a second drain/source terminal of the second floating gate transistor is connected to the first bit line, a first terminal of the third capacitor is connected to a floating gate of the second floating gate transistor, a second terminal of the third capacitor is connected to the erase line, a first terminal of the fourth capacitor is connected to the floating gate of the second floating gate transistor, and a second terminal of the fourth capacitor is connected to the first bit line.

5. The array structure as claimed in claim 1, wherein the first select transistor and the first floating gate transistor are n-type transistors.

6. The array structure as claimed in claim 1, wherein the first gate structure comprises a first gate oxide layer and a first polysilicon gate layer, and the second gate structure comprises a second gate oxide layer and a second polysilicon gate layer.

7. The array structure as claimed in claim 6, wherein a first active region of an assist gate region is located in the third sub-region under the second polysilicon gate layer, and a second active region of an erase gate region is located in the second region and under the second polysilicon gate layer, wherein an area of the first active region is larger than an area of the second active region.

8. The array structure as claimed in claim 6, wherein a first active region of an assist gate region is located in the third sub-region under the second polysilicon gate layer, a second active region of an erase gate region is located in the second region and under the second polysilicon gate layer, and a third active region of the first floating gate transistor is located under the second polysilicon gate layer and arranged between the second doped region and the third doped region, wherein a total area of the first active region and the second active region is larger than an area of the third active region.

9. The array structure as claimed in claim 6, wherein a channel region of the first floating gate transistor is located under the second polysilicon gate layer and arranged between the second doped region and the third doped region, wherein the extension segment of the second gate structure is extended in a same direction as the channel region.

10. The array structure as claimed in claim 1, wherein while a program action is performed, the first source line receives a ground voltage, the first select gate line receives a program voltage, the first bit line receives the program voltage, and the erase line receives a first voltage in a range between the ground voltage and an erase voltage, wherein the erase voltage is higher than the program voltage, and the program voltage is higher the ground voltage.

11. The array structure as claimed in claim 1, wherein while an erase action is performed, the first source line receives a ground voltage, the first select gate line receives the ground voltage, the first bit line receives the ground voltage, and the erase line receives an erase voltage, wherein the erase voltage is higher than the ground voltage.

12. The array structure as claimed in claim 1, wherein while a read action is performed, the first source line receives a ground voltage, the first select gate line receives a read voltage, the first bit line receives the read voltage, and the erase line receives a first voltage in a range between the ground voltage and the read voltage, wherein the read voltage is higher than the ground voltage.

13. The array structure as claimed in claim 1, wherein while a read action is performed, the first source line receives a read voltage, the first select gate line receives the read voltage, the first bit line receives a ground voltage, and the erase line receives a first voltage in a range between the ground voltage and the read voltage, wherein the read voltage is higher than the ground voltage.

14. The array structure as claimed in claim 1, wherein the array structure further comprises a third gate structure formed on the isolation structure located beside the extension segment of the second gate structure.

15. The array structure as claimed in claim 14, wherein the second gate structure and the third gate structure are collaboratively formed as a poly/poly plate capacitor, a first terminal of the poly/poly plate capacitor is connected to a floating gate of the first floating gate transistor, and a second terminal of the poly/poly plate capacitor is connected to an assist gate line.

16. The array structure as claimed in claim 1, wherein the extension segment comprises a first extension segment and a second extension segment, the first extension segment is located at the first side of the second gate structure and the second extension segment is located at the second side of the second gate structure.

17. The array structure as claimed in claim 1, wherein the extension segment is sequentially extended from the second gate structure through the third doped region and the surface of the isolation structure, and then extended to the fourth doped region.

18. The array structure as claimed in claim 17, wherein the second region is located at the second side of the second gate structure.

19. The array structure as claimed in claim 1, wherein the array structure further comprises a second memory cell, and the second memory cell comprises:
- the first gate structure and a third gate structure formed on the surface of the semiconductor substrate corresponding to the first region, wherein the first region is further divided into a fourth sub-region and a fifth sub-region by the first gate structure and the third gate structure, wherein the fourth sub-region is located beside the first side of the first gate structure, the fifth sub-region is arranged between a second side of the first gate structure and a first side of the third gate structure, and the third sub-region is located beside a second side of the third gate structure, wherein a first portion of the third gate structure is externally extended to covered to the second region, and a second portion of the third gate structure is externally extended to covered to the third sub-region;
- a fifth doped region, a sixth doped region and the third doped region formed in the surface of the semiconductor substrate corresponding to the fourth sub-region, the fifth sub-region and the third sub-region, respectively, wherein the fifth doped region is connected to a second source line, and the third doped region is connected to the first bit line; and
- the fourth doped region formed in the surface of the semiconductor substrate corresponding to the second region, wherein the fourth doped region is connected to the erase line;

wherein the fifth doped region, the first gate structure and the sixth doped region are collaboratively formed as a second select transistor, the sixth doped region, the third gate structure and the third doped region are collaboratively formed as a second floating gate transistor, the first portion of the third gate structure and the fourth doped region are collaboratively formed as a third capacitor, and the second portion of the third gate structure and the third doped region are collaboratively formed as a fourth capacitor.

20. The array structure as claimed in claim 19, wherein the array structure further comprises a third memory cell, wherein the third memory cell comprises a third select transistor, a third floating gate transistor, a fifth capacitor and a sixth capacitor, wherein a gate terminal of the third select transistor is connected to a second select line, a first drain/source terminal of the third select transistor is connected to the first source line, a first drain/source terminal of the third floating gate transistor is connected to a second drain/source terminal of the third select transistor, a second drain/source terminal of the third floating gate transistor is connected to the first bit line, a first terminal of the fifth capacitor is connected to a floating gate of the third floating gate transistor, a second terminal of the fifth capacitor is connected to the erase line, a first terminal of the sixth capacitor is connected to the floating gate of the third floating gate transistor, and a second terminal of the sixth capacitor is connected to the first bit line.

* * * * *